(12) United States Patent
Yamazaki

(10) Patent No.: US 7,115,902 B1
(45) Date of Patent: Oct. 3, 2006

(54) ELECTRO-OPTICAL DEVICE AND METHOD FOR MANUFACTURING THE SAME

(75) Inventor: Shunpei Yamazaki, Tokyo (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 09/499,619

(22) Filed: Feb. 7, 2000

Related U.S. Application Data

(62) Division of application No. 08/962,600, filed on Oct. 31, 1997, now Pat. No. 6,306,213, which is a division of application No. 08/231,644, filed on Apr. 22, 1994, now Pat. No. 5,849,601, which is a continuation of application No. 08/217,211, filed on Mar. 24, 1994, now abandoned, which is a continuation of application No. 07/811,063, filed on Dec. 20, 1991, now abandoned.

(30) Foreign Application Priority Data

| Nov. 20, 1990 | (JP) | ............................................. | 2-316598 |
| Nov. 20, 1990 | (JP) | ............................................. | 2-323696 |
| Dec. 25, 1990 | (JP) | ............................................. | 2-418366 |
| Dec. 25, 1990 | (JP) | ............................................. | 2-418366 |
| Dec. 25, 1990 | (JP) | ............................................. | 2-418367 |
| Dec. 25, 1990 | (JP) | ............................................. | 2-418367 |

(51) Int. Cl.
*H01L 29/04* (2006.01)
*H01L 31/36* (2006.01)
*H01L 31/376* (2006.01)
*H01L 31/20* (2006.01)

(52) U.S. Cl. .............................. 257/59; 257/72; 257/350
(58) Field of Classification Search .................. 257/59, 257/72, 350
See application file for complete search history.

(56) References Cited

U.S. PATENT DOCUMENTS 2,819,191 A    1/1958  Fuller (Continued)

FOREIGN PATENT DOCUMENTS

EP    0 161 555    11/1985

(Continued)

OTHER PUBLICATIONS

H. Yanai, *3.3.2. Basic Circuit of Analog Switch*, Semiconductor Handbook, $2^{nd}$ Edition, pp. 842–843, 1977.

(Continued)

*Primary Examiner*—Ngân V. Ngô
(74) *Attorney, Agent, or Firm*—Eric J. Robinson; Robinson Intellectual Property Law Office, P.C.

(57) ABSTRACT

An electro-optical device and a method for manufacturing the same are disclosed. The device comprises a pair of substrates and an electro-optical modulating layer (e.g. a liquid crystal layer having sandwiched therebetween, said pair of substrates consisting of a first substrate having provided thereon a plurality of gate wires, a plurality of source (drain) wires, and a pixel matrix comprising thin film transistors, and a second substrate facing the first substrate, wherein, among the peripheral circuits having established on the first substrate and being connected to the matrix wirings for the X direction and the Y direction, only a part of said peripheral circuits is constructed from thin film semiconductor devices fabricated by the same process utilized for an active device, and the rest of the peripheral circuits is constructed from semiconductor chips. The liquid crystal display device according to the present invention is characterized by that the peripheral circuits are not wholly fabricated into thin film transistors, but only those portions having a simple device structure, or those composed of a small number of devices, or those comprising an IC not easily available commercially, or those comprising an expensive integrated circuit, are fabricated by thin film transistors. According to the present invention, an electro-optical device is provided at an increased production yield with a reduced production cost.

49 Claims, 10 Drawing Sheets

U.S. PATENT DOCUMENTS

| | | |
|---|---|---|
| 3,821,781 A | 6/1974 | Chang et al. |
| 4,068,020 A | 1/1978 | Reuschel |
| 4,103,297 A | 7/1978 | McGreivy et al. |
| 4,239,346 A | 12/1980 | Lloyd |
| 4,363,828 A | 12/1982 | Brodsky et al. |
| 4,365,013 A | 12/1982 | Ishioka et al. |
| 4,378,417 A | 3/1983 | Maruyama et al. |
| 4,395,726 A | 7/1983 | Maeguchi |
| 4,460,670 A | 7/1984 | Ogawa et al. |
| 4,470,060 A | 9/1984 | Yamazaki |
| 4,500,388 A | 2/1985 | Ohmura et al. |
| 4,565,584 A | 1/1986 | Tamura et al. |
| 4,581,476 A | 4/1986 | Yamazaki |
| 4,581,620 A | 4/1986 | Yamazaki |
| 4,584,025 A | 4/1986 | Takaoka et al. |
| 4,591,892 A | 5/1986 | Yamazaki |
| 4,597,160 A | 7/1986 | Ipri |
| 4,621,276 A | 11/1986 | Malhi |
| 4,651,408 A | 3/1987 | MacElwee et al. |
| 4,655,551 A | 4/1987 | Washizuka et al. |
| 4,659,392 A | 4/1987 | Vasudev |
| 4,680,580 A | 7/1987 | Kawahara |
| 4,690,717 A | 9/1987 | Yamazaki |
| 4,693,759 A | 9/1987 | Noguchi et al. |
| 4,697,887 A | 10/1987 | Okada et al. |
| 4,703,552 A | 11/1987 | Baldi et al. |
| 4,729,009 A | 3/1988 | Ang |
| 4,740,829 A | 4/1988 | Nakagiri et al. |
| 4,743,567 A | 5/1988 | Pandya et al. |
| 4,755,865 A | 7/1988 | Wilson et al. |
| 4,760,008 A | 7/1988 | Yamazaki et al. |
| 4,766,477 A | 8/1988 | Nakagawa et al. |
| 4,772,927 A | 9/1988 | Saito et al. |
| 4,795,679 A | 1/1989 | Ramesh et al. |
| 4,814,842 A | 3/1989 | Nakagawa et al. |
| 4,818,077 A | 4/1989 | Ohwada et al. |
| 4,838,654 A | 6/1989 | Hamaguchi et al. |
| 4,849,797 A | 7/1989 | Ukai et al. |
| 4,860,069 A | 8/1989 | Yamazaki |
| 4,862,237 A | 8/1989 | Morozumi |
| 4,864,376 A | 9/1989 | Aoki et al. |
| 4,885,052 A | 12/1989 | Fan et al. |
| 4,888,305 A | 12/1989 | Yamazaki et al. |
| 4,891,330 A | 1/1990 | Guha et al. |
| 4,897,360 A | 1/1990 | Guckel et al. |
| 4,905,073 A | 2/1990 | Chen |
| 4,938,565 A | 7/1990 | Ichikawa |
| 4,942,441 A | 7/1990 | Konishi et al. |
| 4,949,141 A | 8/1990 | Busta |
| 4,951,113 A | 8/1990 | Huang et al. |
| 4,959,700 A | 9/1990 | Yamazaki |
| 4,969,025 A | 11/1990 | Yamamoto et al. |
| 4,969,031 A | 11/1990 | Kobayashi et al. |
| 4,986,213 A | 1/1991 | Yamazaki et al. |
| 4,988,638 A | 1/1991 | Huang et al. |
| 5,003,356 A | 3/1991 | Wakai et al. |
| 5,012,228 A | 4/1991 | Masuda et al. |
| 5,028,916 A | 7/1991 | Ichikawa et al. |
| 5,032,883 A * | 7/1991 | Wakai et al. |
| 5,037,766 A | 8/1991 | Wang |
| 5,043,772 A | 8/1991 | Yamazaki |
| 5,051,570 A | 9/1991 | Tsujikawa et al. |
| 5,055,899 A | 10/1991 | Wakai et al. |
| 5,056,895 A | 10/1991 | Kahn |
| 5,057,889 A | 10/1991 | Yamada et al. |
| 5,057,898 A | 10/1991 | Adan et al. |
| 5,065,208 A | 11/1991 | Shah |
| 5,077,223 A | 12/1991 | Yamazaki |
| 5,082,351 A | 1/1992 | Fergason |
| 5,084,905 A | 1/1992 | Sasaki et al. |
| 5,132,754 A | 7/1992 | Serikawa et al. |
| 5,132,820 A | 7/1992 | Someya et al. |
| 5,132,821 A | 7/1992 | Nicholas |
| 5,148,301 A | 9/1992 | Sawatsubashi et al. |
| 5,151,689 A | 9/1992 | Kabuto et al. |
| 5,236,544 A | 8/1993 | Yamagata |
| 5,247,191 A | 9/1993 | Yamazaki et al. |
| 5,250,818 A | 10/1993 | Saraswat et al. |
| 5,250,931 A | 10/1993 | Misawa et al. |
| 5,261,153 A | 11/1993 | Lucas |
| 5,261,156 A | 11/1993 | Mase et al. |
| 5,270,224 A | 12/1993 | Furumura et al. |
| 5,270,567 A | 12/1993 | Mori et al. |
| 5,274,279 A | 12/1993 | Misawa et al. |
| 5,281,840 A | 1/1994 | Sarma |
| 5,287,205 A | 2/1994 | Yamazaki et al. |
| 5,289,030 A | 2/1994 | Yamazaki et al. |
| 5,289,300 A | 2/1994 | Yamazaki et al. |
| 5,313,076 A | 5/1994 | Yamazaki et al. |
| 5,315,132 A | 5/1994 | Yamazaki |
| 5,327,001 A | 7/1994 | Wakai et al. |
| 5,341,012 A | 8/1994 | Misawa et al. |
| 5,349,204 A | 9/1994 | Yamazaki |
| 5,349,226 A | 9/1994 | Kawaguchi et al. |
| 5,372,958 A | 12/1994 | Miyasaka et al. |
| 5,383,041 A | 1/1995 | Yamazaki et al. |
| 5,402,041 A | 3/1995 | Kishino et al. |
| 5,404,175 A | 4/1995 | Nagae et al. |
| 5,418,636 A | 5/1995 | Kawasaki |
| 5,424,752 A | 6/1995 | Yamazaki et al. |
| 5,426,526 A | 6/1995 | Yamamoto et al. |
| 5,453,858 A | 9/1995 | Yamazaki |
| 5,481,121 A | 1/1996 | Zhang et al. |
| 5,500,538 A | 3/1996 | Yamazaki et al. |
| 5,514,879 A | 5/1996 | Yamazaki |
| 5,530,266 A | 6/1996 | Yonehara et al. |
| 5,539,550 A | 7/1996 | Spitzer et al. |
| 5,568,288 A | 10/1996 | Yamazaki et al. |
| 5,583,347 A | 12/1996 | Misawa et al. |
| 5,591,990 A | 1/1997 | Misawa et al. |
| 5,612,799 A | 3/1997 | Yamazaki et al. |
| 5,614,732 A | 3/1997 | Yamazaki |
| 5,616,936 A | 4/1997 | Misawa et al. |
| 5,616,944 A | 4/1997 | Mizutani et al. |
| 5,644,147 A | 7/1997 | Yamazaki et al. |
| 5,648,685 A | 7/1997 | Misawa et al. |
| 5,656,826 A | 8/1997 | Misawa et al. |
| 5,677,212 A | 10/1997 | Misawa et al. |
| 5,701,167 A | 12/1997 | Yamazaki |
| 5,712,495 A | 1/1998 | Suzawa |
| 5,714,771 A | 2/1998 | Misawa et al. |
| 5,744,818 A | 4/1998 | Yamazaki et al. |
| 5,744,824 A | 4/1998 | Kousai et al. |
| 5,754,158 A | 5/1998 | Misawa et al. |
| 5,780,872 A | 7/1998 | Misawa et al. |
| 5,808,595 A | 9/1998 | Kubota et al. |
| 5,811,837 A | 9/1998 | Misawa et al. |
| 5,818,070 A | 10/1998 | Yamazaki et al. |
| 5,846,320 A | 12/1998 | Matsuyama et al. |
| 5,849,601 A | 12/1998 | Yamazaki |
| 5,851,440 A | 12/1998 | Tanaka et al. |
| 5,889,291 A | 3/1999 | Koyama et al. |
| 5,899,547 A | 5/1999 | Yamazaki et al. |
| 5,904,511 A | 5/1999 | Misawa et al. |
| 5,905,555 A | 5/1999 | Yamazaki et al. |
| 5,933,205 A | 8/1999 | Yamazaki et al. |
| 5,963,278 A | 10/1999 | Yamazaki et al. |
| 6,023,075 A | 2/2000 | Yamazaki |
| 6,252,249 B1 | 6/2001 | Yamazaki |
| 6,306,213 B1 | 10/2001 | Yamazaki |
| 6,747,627 B1 | 6/2004 | Koyama et al. |

FOREIGN PATENT DOCUMENTS

| | | |
|---|---|---|
| EP | 0321073 | 6/1989 |
| EP | 0 337 457 | 10/1989 |
| JP | 49-77537 | 7/1974 |
| JP | 53-027483 | 3/1978 |
| JP | 53-144297 | 12/1978 |
| JP | 54-154992 | 12/1978 |
| JP | 54-154992 | 12/1979 |
| JP | 55-011329 | 1/1980 |
| JP | 55-32026 | 3/1980 |
| JP | 55-029154 | 3/1980 |
| JP | 55-050663 | 4/1980 |
| JP | 55-050664 | 4/1980 |
| JP | 5582458 | 6/1980 |
| JP | 55-082458 | 6/1980 |
| JP | 56-059291 | 5/1981 |
| JP | 56-067884 | 6/1981 |
| JP | 56-070586 | 6/1981 |
| JP | 57-099729 | 6/1982 |
| JP | 57-100467 | 6/1982 |
| JP | 58-004180 | 1/1983 |
| JP | 58-27364 | 2/1983 |
| JP | 58-74080 | 5/1983 |
| JP | 58-088787 | 5/1983 |
| JP | 58-092217 | 6/1983 |
| JP | 58-155773 | 9/1983 |
| JP | 58-155774 | 9/1983 |
| JP | 58-161380 | 9/1983 |
| JP | 58-182816 | 10/1983 |
| JP | 58-199564 | 11/1983 |
| JP | 58-207073 | 12/1983 |
| JP | 59-035423 | 2/1984 |
| JP | 59-035488 | 2/1984 |
| JP | 59-072128 | 4/1984 |
| JP | 59-072182 | 4/1984 |
| JP | 59-099887 | 6/1984 |
| JP | 59-115574 | 7/1984 |
| JP | 60-138909 | 7/1985 |
| JP | 60-245172 | 12/1985 |
| JP | 60-245173 | 12/1985 |
| JP | 60-245174 | 12/1985 |
| JP | 61-004021 | 1/1986 |
| JP | 61-005578 | 1/1986 |
| JP | 61-80226 | 4/1986 |
| JP | 61-080226 | 4/1986 |
| JP | 61-126595 | 6/1986 |
| JP | 61-136262 | 6/1986 |
| JP | 61-140296 | 6/1986 |
| JP | 61-141174 | 6/1986 |
| JP | 61-156025 | 7/1986 |
| JP | 61-175622 | 8/1986 |
| JP | 62-052924 | 3/1987 |
| JP | 62-115745 | 5/1987 |
| JP | 62-126677 | 6/1987 |
| JP | 62-147759 | 7/1987 |
| JP | 62-160425 | 7/1987 |
| JP | 62-229873 | 10/1987 |
| JP | 63-29729 | 2/1988 |
| JP | 63-96636 | 4/1988 |
| JP | 63-070149 | 5/1988 |
| JP | 63-100777 | 5/1988 |
| JP | 63-165896 | 7/1988 |
| JP | 63-219172 | 9/1988 |
| JP | 63-237570 | 10/1988 |
| JP | 63-237571 | 10/1988 |
| JP | 64-001273 | 1/1989 |
| JP | 64-010711 | 1/1989 |
| JP | 1-30272 | 2/1989 |
| JP | 64-047076 | 2/1989 |
| JP | 6468724 | 3/1989 |
| JP | 64-68728 | 3/1989 |
| JP | 64-068724 | 3/1989 |
| JP | 01-107237 | 4/1989 |
| JP | 1107237 | 4/1989 |
| JP | 01-128534 | 5/1989 |
| JP | 1-130131 | 5/1989 |
| JP | 1-156725 | 6/1989 |
| JP | 01-223719 | 9/1989 |
| JP | 01-236731 | 9/1989 |
| JP | 01-268064 | 10/1989 |
| JP | 01-272146 | 10/1989 |
| JP | 1-289917 | 11/1989 |
| JP | 01-289917 | 11/1989 |
| JP | 02-027320 | 1/1990 |
| JP | 2-51129 | 2/1990 |
| JP | 262077 | 3/1990 |
| JP | 2-90531 | 3/1990 |
| JP | 02-062077 | 3/1990 |
| JP | 02-067817 | 3/1990 |
| JP | 2-103925 | 4/1990 |
| JP | 2-115824 | 4/1990 |
| JP | 02-136831 | 5/1990 |
| JP | 2-137822 | 5/1990 |
| JP | 02-165620 | 6/1990 |
| JP | 02-085473 | 7/1990 |
| JP | 2-174170 | 7/1990 |
| JP | 2-188723 | 7/1990 |
| JP | 2-201967 | 8/1990 |
| JP | 02-207537 | 8/1990 |
| JP | 02-207686 | 8/1990 |
| JP | 02-208635 | 8/1990 |
| JP | 2-208943 | 8/1990 |
| JP | 2-210330 | 8/1990 |
| JP | 02-210330 | 8/1990 |
| JP | 02-211428 | 8/1990 |
| JP | 02-216129 | 8/1990 |
| JP | 2-217826 | 8/1990 |
| JP | 02-220474 | 9/1990 |
| JP | 02-223912 | 9/1990 |
| JP | 2-223912 | 9/1990 |
| JP | 22-23912 | 9/1990 |
| JP | 2-234134 | 9/1990 |
| JP | 02-245739 | 10/1990 |
| JP | 2-251992 | 10/1990 |
| JP | 02-251992 | 10/1990 |
| JP | 03-071382 | 7/1991 |
| JP | 03-081922 | 8/1991 |
| JP | 3-246973 | 11/1991 |
| JP | 03-255425 | 11/1991 |
| JP | 3-290924 | 12/1991 |
| JP | 04-042214 | 2/1992 |
| JP | 04-186635 | 7/1992 |
| JP | 4-245655 | 9/1992 |
| JP | 58-27365 | 2/1993 |
| JP | 05-134272 | 5/1993 |
| JP | 06-088971 | 3/1994 |
| JP | 2-208635 | 8/1998 |
| JP | 2-208636 | 8/1998 |
| JP | 2791422 | 8/1998 |
| JP | 3109570 | 11/2000 |
| KR | 90-17171 | 11/1990 |
| KR | 92-18644 | 10/1992 |

OTHER PUBLICATIONS

Akiyama et al., "An Active Matrix LCD With Integrated Driver Circuits Uing a Sl TFTs", Japan Display, pp. 212–215.

A.C. Adams, VLSI TECHNOLOGY, Edied by S.M. Sze, McGraw–Hill Book Company, "Chapter 6 Dielectric and Polysilicon Film Deposition", pp. 233–235.

Scheid, et al., "Super Large Grain Polycrystalline Silicon Obtained From Pyrolysis of $Si_2H_6$ and Annealing", Jap. J. Appl. Phys. vol. 29, No. 11, Nov., 1990, pp. L 2105–07.

Blum et al., "Low Pressure CVD–Process for Micro and Polycrystalline Silicon", IBM Technical Disclosure Bulletin, vol. 26, No. 3A, Aug. 1983, p. 921–922.

Madsen et al., "In Situ Doping of silicon Films Prepared by Low Pressure Chemical Vapor Deposition Using Dililane and Phosphine", J. Electrochem. Soc., col. 137, No. 7, Jul. 1990, pp. 2246–2251.

Wolf et al., "Silicon Processing for the VLSI Era", vol. 1: Process Technology, Lattice Press, Sunset Beach, CA (1986), pp. 175–176.

H. Ohshima et al., "Future Trends for TFT Integrated Circuits on Glass Substrates", IEDM (IEEE 1989), pp. 157–160.

Tsai et al., Journal of Non–Crystalline Solids, vols. 59, 60, Dec. 1983, Part II, pp. 731–734, Proceedings of the Xth International Conference on Amorphous and Liquid Semiconductors, Tokyo, Japan, Aug. 22–26, 1983.

Charles MaGee and David E. Carlson, Solar Cells 2, (1980), "Investigation of the Hydrogen and Impurity Contents of Amorphous Silicon by Secondary Ion Mass Spectrometry", RCA LAboratories, Princeton, N.J., pp. 365–376.

"The Physics of Hydrogenated Amorphous Silicon I Structure, Preparation, and Devices", Edited by J.D. Joannopoulos and G. Lucovsky, Springer–Verlag, Berlin Heidelberg, New York, Tokyo 1984, pp. 8–9 & 38–41.

Masakiyo Matsumura, "(Invited) Amorphous Silicon Transistors and Integrated Circuits", Japanese Journal of Applied Physics, vol. 22, (1983) Supplement 22–1, pp. 487–491.

Shunsuke Kobayashi, "Color Liquid Crystal Display", Dec. 14, 1990, pp. 162–166.

M. Aklyama et al., "An Active Matrix LCD With Integrated Driver Circuits Using a Si TFTs", Japan Display, pp. 212–215.

Lewis, et al., "Active Matrix Liquid Crystal Display Design Using Low and High Temperature Processed Polysilicon TFTS", 1990, pp. 843–846, IEEE, CH 2865, 34.1.1.

Lewis et al., "Active Matrix Liquid Crystal Display Using Low and High Temperature Processed Polysilicon TFTS", 1990, pp. 843–846, IEDM Ch. 2865, 34.1.1.

Hatalis et al., "High Performance Thin Film Transistors in Low–Temperature Crystallized LPCVD Amorphous Silicon Films", Aug. 1987, pp. 361–364, IEEE Electron Device Letters, vol. EDL–8, No. 8.

Integrated Circuit Engineering (1) Process and Device Technology Chapter, p. 145, Apr. 5, 1979.

Integrated Circuit Engineering (2) Circuit Technology Chapter, pp. 107–125, Jun. 20, 1979.

Office Action of Feb. 25, 2005 in U.S. Appl. No. 09/832,844 to Yamazaki.

Kazuo Inoue, *Flat Panel Display 1991*, pp. 181–188, Nov. 26, 1990.

\* cited by examiner

ELECTRO-OPTICAL DEVICE AND METHOD FOR MANUFACTURING THE SAME

This application is a Divisional of application Ser. No. 08/962,600 filed Oct. 31, 1997 now U.S. Pat. No. 6,306,213; which itself is a Divisional of Ser. No. 08/231,644 filed Apr. 22, 1994, now U.S. Pat. No. 5,849,601; which itself is a Continuation of Ser. No. 08/217,211 filed Mar. 24, 1994, abandoned; which is a Continuation of Ser. No. 07/811,063 filed Feb. 20, 1991, abandoned; which is a Continuation-in-Part of Ser. No. 08/293,201 filed Aug. 19, 1994, now U.S. Pat. No. 5,614,732; which is a Continuation of Ser. No. 07/967,564 filed Oct. 28, 1992, abandoned; which is a Continuation of Ser. No. 07/673,821 filed Mar. 21, 1991, abandoned.

BACKGROUND OF THE INVENTION

1. Field of the Invention

The present invention relates to an electro-optical device which comprises thin film transistors (referred to hereinafter as TFTs) and to a method for manufacturing such a device.

2. Description of the Prior Art

More attention is now paid to flat displays than to CRTs (cathode ray tubes) for use in office automation (OA) machines and the like, and particularly, there is an increasing demand for large-area display devices. There is also an active and rapid development in the application field of flat displays such as wall television (TV) sets. Furthermore, there are demands for color flat displays and finer display images.

A liquid crystal display device is known as a representative example of a flat display. A liquid crystal display device comprises a pair of glass substrates having incorporated therebetween a liquid crystal composition together with electrodes, and the images are displayed by the change of state of the liquid crystal composition upon application of an electric field thereto. The liquid crystal cells may be driven by the use of a TFT or other switching devices, or by making it into a simple matrix structure. In any case, a driver circuit is established at the periphery of a display to supply signals for driving liquid crystals to column lines (extending in Y direction) and row lines (extending in X direction).

The driver circuit is generally composed of a single crystal silicon MOS integrated circuit (IC). The IC is provided with pad electrodes, each corresponding to each of the display electrodes, and a printed circuit board is incorporated between the pad and the display electrodes to connect first the pad electrode of the IC with the printed circuit board and then the printed circuit board with the display. The printed circuit board, which in general is made of an insulator board made from materials such as a glass fiber-reinforced epoxy resin or a paper filled epoxy resin, or of a flexible plastic board, requires an area equivalent to or even larger than the display area. Similarly, the volume thereof should have to be made considerably large.

Thus, because of the construction as described hereinabove, a conventional display suffers problems as follows:

(1) A superfine display cannot be realized. Since each of the wirings of the display electrodes for the X direction and the Y direction of the matrix, or the source (drain) wirings or the gate wirings should be connected individually to each of the contacts on the printed board, the minimum distance between the connecting portions technologically achievable by the up-to-date surface mounting technology is limited to a certain length;

(2) A display device as a whole occupies a large area and volume. A display device comprises indispensable parts in addition to the display itself, inclusive of the printed circuit board, the ICs, and the connecting wirings, which require an area and volume about several times as large as those of the display alone; and (3) The connections are of low reliability. Quite a large number of connections should be established between the main display and the printed circuit board, as well as between the printed circuit board and the ICs; moreover, not a small weight is casted on the connecting portions.

As a means to overcome the foregoing problems, there is proposed, particularly in a display device comprising an active matrix as the switching device, to construct a display device comprising the active device and the peripheral circuits on a same substrate using TFTs rather than semiconductor chips. Such a construction indeed solves the three problems mentioned hereinabove, however, it newly develops problems as follows:

(4) The production yield of the display is low. Since the peripheral circuits also are made from TFTs, the number of the devices to be fabricated on the same substrate is increased and hence the production yield of the TFT is lowered;

(5) The production cost is increased. Since the peripheral circuit portion comprises a very complicated device structure, the circuit pattern accordingly becomes complicated and hence the cost increases. Furthermore, with the increase in the multilayered wiring portion, an increase in process steps as well as a decrease in the production yield of the TFTs occur; and (6) It requires a treatment at a high temperature and hence the use of an expensive quartz substrate becomes requisite. Since a quick response is required to the transistors which constitute the peripheral circuit, the semiconductor layer should be treated at a high temperature to obtain a polycrystalline layer to be used as the transistors.

SUMMARY OF THE INVENTION

An object of the present invention is to overcome the six problems mentioned above by taking balance among them and to provide a more economical electro-optical device at a high yield.

This and other objects of the present invention have been attained by an electro-optical device comprising a pair of substrates and an electro-optical modulating layer having sandwiched therebetween, said pair of substrates consisting of a first substrate having provided thereon thin film transistors and matrix lines comprising a plurality of gate wires (extending e.g. in Y direction) and a plurality of source (drain) wires (extending e.g. in X direction), and a second substrate facing the first substrate, wherein, among the peripheral circuits being connected to the matrix lines, only one direction side of said peripheral circuits is constructed from thin film semiconductor devices fabricated by the same process utilized for the thin film transistors, and the rest of the peripheral circuits is constructed from semiconductor chips. The electro-optical modulating layer may comprise a liquid crystal.

In the electro-optical device according to the present invention, the peripheral circuit only on one side is fabricated as TFTs. In such a manner, a general use economical ICs can be utilized on one side, while fabricating the side comprising peripheral circuits which are not commercially available or which are costly, as TFTs.

Furthermore, by making only one side into TFTs, the number of the TFTs in the peripheral circuit portion can be considerably reduced. For example, the number of the TFTs can be halved in case the peripheral circuits for the X and the Y directions have the same function. Thus, the production yield of a TFT on the same substrate is increased by two times in a simple calculation.

According to another embodiment of the present invention, there is provided an electro-optical device comprising a first substrate having provided thereon a pixel matrix furnished with complementary TFTs and matrix lines comprising a plurality of gate wires (extending e.g. in Y direction) and a plurality of source (drain) wires (extending e.g. in X direction), said first substrate making a pair with a second substrate faced thereto and an electro-optical modulating layer having supported between the pair of substrates, characterized by that at least a part of the peripheral circuits being connected to the matrix lines is fabricated into complementary TFTs similar in structure of the active matrix (e.g. the complementary TFTs of the pixel matrix) and being fabricated also in a same process as that of the active matrix, and that the rest of the peripheral circuits are constructed by semiconductor chips, said peripheral circuits being connected to the X or Y direction matrix wires having established on the first substrate. The electro-optical modulating layer may comprise a liquid crystal.

More precisely, the electro-optical device according to the present invention is characterized by that the peripheral circuit is not wholly fabricated into TFTs, but only those portions having a simple device structure, or those composed of a small number of devices, or those comprising an IC not easily available commercially, or those comprising an expensive IC, are fabricated as TFTs. It is therefore an object of the present invention to increase the production yield and to reduce the production cost of an electro-optical device.

Accordingly, by fabricating a part of the peripheral circuits as TFTs, the number of external ICs is reduced and therefore the production cost is reduced.

Furthermore, by fabricating the peripheral circuits and the active matrix in the same process to give complementary TFTs (CTFTs), the pixel driving capacity is increased and a redundancy is imparted to the peripheral circuit. Hence it is possible to drive the electro-optical device with a greater allowance.

If the peripheral circuits were to be wholly fabricated into TFTs, the device requires extension of the display substrate along both of the X and Y directions. This inevitably leads to an unfavorable increase in the total occupancy area. In contrast, if only a part of the peripheral circuits were to be fabricated into TFTs, it results in a slight increase of the substrate which can be readily accommodated to the outer dimension of the computers and other apparatuses to which the electro-optical device is assembled. Thus, there is provided an electro-optical device having a small occupancy area and volume.

A high technology is required to fabricate the complicated portions in the peripheral circuit as TFTs. For example, a device structure which requires a multilayered wiring, or a portion having a function as an amplifier can be mentioned as those particular portions. However, if the peripheral circuit were to be partially made into TFTs by replacing only the simple device structures and portions of simple function with TFTs while using the conventional ICs for the portions in which high technology is required, an electro-optical device can be realized at reduced cost with a high yield.

Furthermore, a partial adoption of TFTs considerably reduces the number of TFTs within the peripheral circuit portion. In a simple calculation, it can be seen that the number of the TFTs can be reduced to a half if the function of the TFTs for the X direction and the Y direction were the same. It is possible, by reducing the number of devices to be fabricated as TFTs, to increase the production yield of the substrate. In addition, there is provided a low cost electro-optical device reduced both in the area of the substrate and in volume.

In an electro-optical device according to an embodiment of the present invention, a single pixel may be constructed by connecting two or more CTFTs with a pixel. Otherwise, a single pixel may be divided into two or more pixels, and to each of the divided pixels may be connected one or more CTFTs.

The ICs of the residual peripheral circuit portions which are not fabricated as TFTs are connected with the substrate by a surface mounting technology (SMT) such as a Chip on Glass (COG) process which comprises directly mounting the IC chips on a substrate and connecting them with each of the connecting terminals, and a Tape Automated Bonding (TAB) process which comprises mounting each of the IC chips on a flexible support made of an organic resin, and then connecting the resin support with the display substrate.

It is further possible to fabricate the semiconductor layers of the TFTs at a lower temperature and yet to realize quick response TFTs having a considerably increased carrier mobility by taking advantage of, instead of the conventional polycrystalline or amorphous semiconductors, a semi-amorphous semiconductor which is based on a novel concept.

The semi-amorphous semiconductor can be obtained by applying a heat treatment to crystallize a thin film having deposited by processes such as low-pressure chemical vapor deposition (LPCVD), sputtering, plasma-assisted chemical vapor deposition (PCVD), and the like. The process for fabricating a semi-amorphous semiconductor film is described below referring to the sputtering process as an example.

In depositing a film by sputtering from a single crystal target of a silicon semiconductor under a mixed gas atmosphere comprising hydrogen and argon, the heavy argon atoms strike the surface of the silicon target to release free silicon atoms. The free silicon atoms thus released from the target then travel to the substrate on which the film is to be deposited, accompanied by clusters composed of several tens to several millions of silicon atoms. During their travel in the sputtering chamber, hydrogen atoms come to bond with the dangling bonds of the silicon atoms located at the outer periphery of the clusters, and these clusters comprising the silicon-hydrogen bonding are maintained to the surface of the substrate to deposit as a relatively ordered region. Thus, a highly ordered film comprising a mixture of amorphous silicon and clusters accompanied by Si—H bondings on the periphery is realized on the surface of the substrate. By further heat treating the deposited film in the temperature range of from 450 to 700° C. in a non-oxidizing atmosphere, the Si—H bondings on the outer periphery of the clusters react with each other to yield Si—Si bondings. The Si—Si bondings thus obtained exert a strong attractive force to each other. At the same time, however, the clusters in their highly ordered state are susceptible to undergo phase transition to attain a more ordered state, i.e., a crystallized state. Thus, because the Si—Si bondings in the neighboring clusters attract each other, the resulting crystals suffer lattice distortion which can be observed by laser Raman spectroscopy as a peak deviated in position to the lower frequency side from the 520 cm$^{-1}$ which corresponds to the peak of a single crystal of silicon.

Furthermore, since the Si—Si bondings between the neighboring clusters cause anchoring (connecting) effects, the energy band in each cluster is electrically connected with that of the neighboring cluster through the anchored locations. Accordingly, since there is no grain boundaries as in the conventional polycrystalline silicon which function as a barrier to the carriers, a carrier mobility as high as in the range of from 10 to 200 cm$^2$/V·sec can be obtained. That is, the semi-amorphous semiconductor defined above is apparently crystalline, however, if viewed from the electrical properties, there can be assumed a state substantially free from grain boundaries. If the annealing of a silicon semiconductor were to be effected at a temperature as high as 1000° C. or over, instead of a moderate annealing in the temperature range of from 450 to 700° C. as referred hereinbefore, the crystallization naturally would induce crystal growth to precipitate oxygen and the like at the grain boundaries and would develop a barrier. The resulting material is then a polycrystalline material comprising single crystals and grain boundaries.

In the semi-amorphous semiconductors, the carrier mobility increases with elevating degree of anchoring. To enhance carrier mobility and to allow the crystallization to take place at a temperature lower than 600° C., the oxygen content of the film should be controlled to 7×10$^{19}$ cm$^{-3}$ or lower, preferably, to 1×10$^{19}$ cm$^{-3}$ or lower.

DETAILED DESCRIPTION OF THE PRESENT INVENTION

The present invention is described in further detail below referring to non-limiting examples.

EXAMPLE 1

Figure 1:
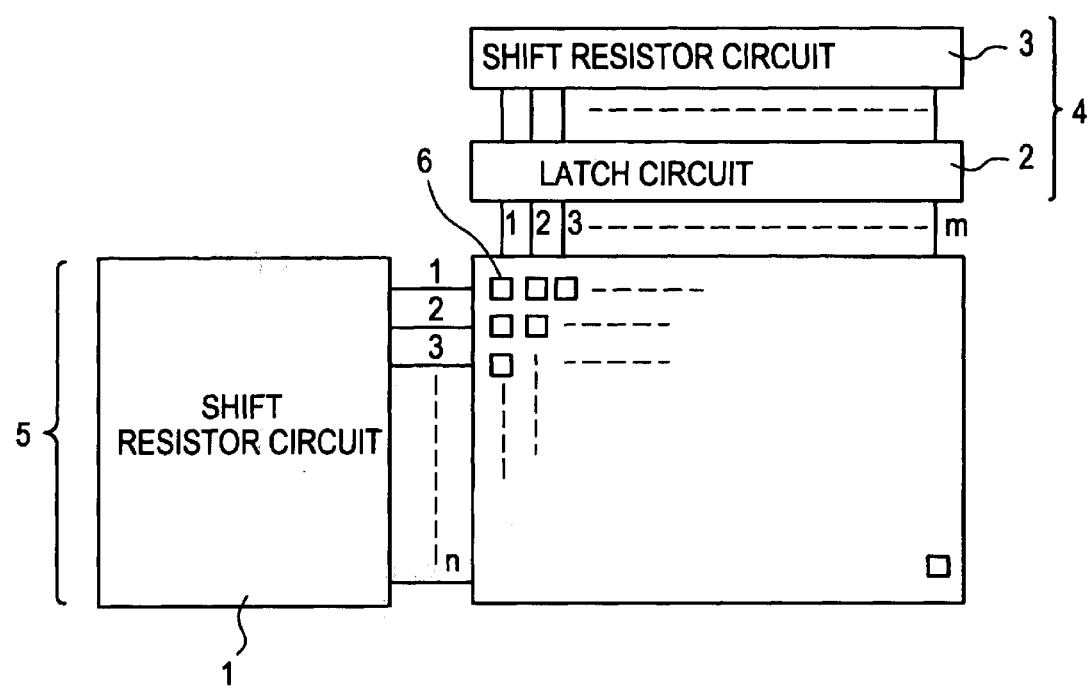
FIG. 1 is a schematic view illustrating a liquid crystal display device according to an embodiment of the present invention, composed of an m×n circuit structure.
Figure 2:
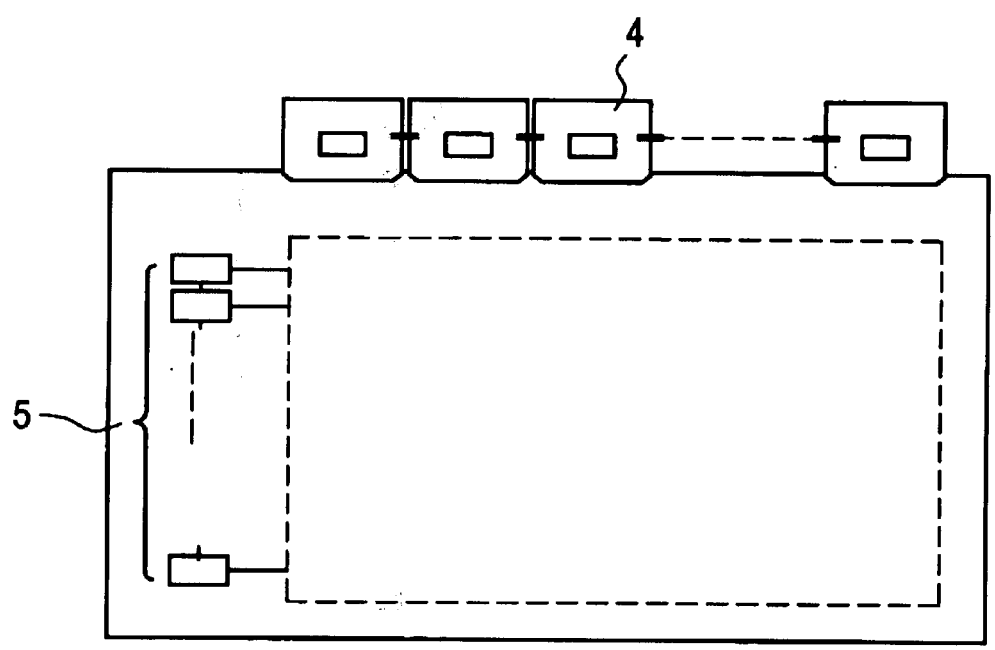
FIG. 2 is an outer appearance of a liquid crystal display device according to an embodiment of the present invention.

Referring to FIG. 1, a liquid crystal display device having an m×n circuit structure is described. In FIG. 2 is also given the outer appearance of the liquid crystal display device. In FIG. 1, a shift register circuit portion 1 (a means for supplying a signal to a wiring of the X direction) being connected to a wiring of the X direction is solely fabricated as TFTs 5 in a similar manner as an active device provided to a pixel 6, and a peripheral circuit portion (a means for supplying a signal to a wiring of the Y direction) connected to a wiring of the Y direction is provided as ICs 4 which is connected to the substrate by TAB. The thin film transistors provided in the pixel 6 as the active device and the thin film transistors 5 constituting the shift register circuit portion 1 are provided on a single substrate.

Figure 6:
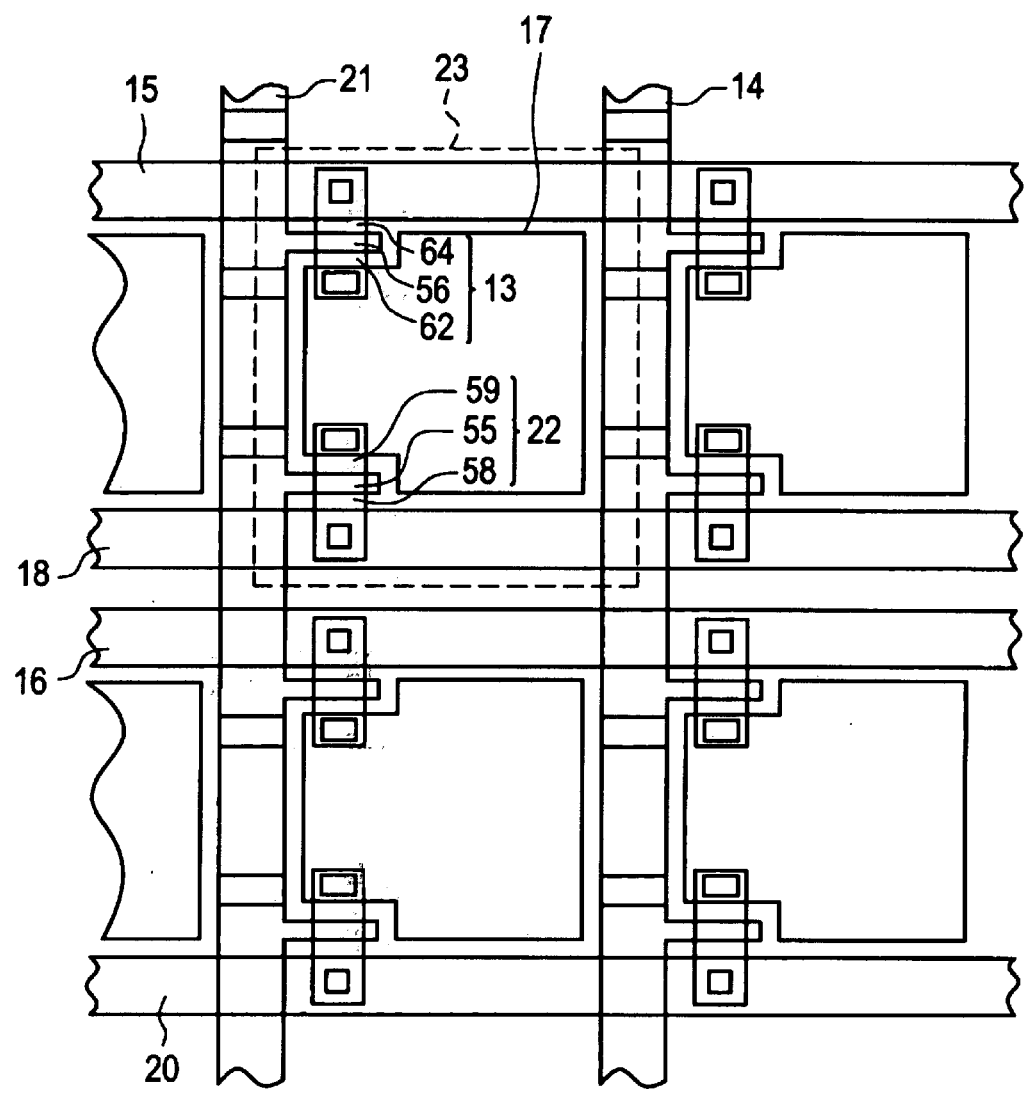
FIG. 6 is a schematic representation illustrating the arrangement of the pixel portion of a liquid crystal display device according to an embodiment of the present invention.

The actual arrangement of the electrodes and the like corresponding to this circuit structure is shown in FIG. 6. In FIG. 6, however, the structure is simplified and shown in a 2×2 structure.

Referring to FIG. 3, the process for fabricating the TFTs of the liquid crystal display device according to the present invention is explained. In FIG. 3(A), a silicon oxide film is deposited to a thickness of from 1,000 to 3,000 Å as a blocking layer 51 by radio frequency (RF) magnetron sputtering on a glass substrate 50 made of an economical glass which resists to a temperature of 700° C. or less, e.g., about 600° C. The actual film deposition was carried out in a 100% oxygen atmosphere at a film deposition temperature of 15° C., at an output of from 400 to 800 W, and a pressure of 0.5 Pa. The film deposition rate using a quartz or a single crystal silicon as the target was in the range of from 30 to 100 Å/minute.

On the silicon oxide film thus obtained was further deposited a silicon film, e.g. an amorphous silicon film, by LPCVD (low-pressure chemical vapor deposition), sputtering, or plasma-assisted CVD (PCVD).

In case of the LPCVD process, film deposition was conducted at a temperature lower than the crystallization temperature by 100 to 200° C., i.e., in the range of from 450 to 550° C., e.g., at 530° C., by supplying disilane (Si$_2$H$_6$) or trisilane (Si$_3$H$_8$) to the CVD apparatus. The pressure inside the reaction chamber was controlled to be in the range of from 30 to 300 Pa. The film deposition rate was 50 to 250 Å/minute. Furthermore, optionally boron may be supplied to 1×10$^{15}$ to 1×10$^{18}$ atoms·cm$^{-3}$ in the film as diborane during the film deposition to control the threshold voltage (V$_{th}$) of the N-TFT and that of the P-TFT to be approximately the same.

In case of sputtering, film deposition was conducted using a single crystal silicon as the target in an argon atmosphere having added therein from 20 to 80% of hydrogen, e.g., in a mixed gas atmosphere containing 20% of argon and 80% of hydrogen. The back pressure prior to sputtering was controlled to 1×10$^{-5}$ Pa or lower. The film was deposited at a film deposition temperature of 150° C., a frequency of 13.56 MHz, a sputter output of from 400 to 800 W, and a pressure of 0.5 Pa.

In case of the deposition of a silicon film by a PCVD process, the temperature was maintained, e.g., at 300° C., and monosilane (SiH$_4$) or disilane (Si$_2$H$_6$) was used as the reacting gas. A high frequency electric power was applied at 13.56 MHz to the gas inside the PCVD apparatus to effect the film deposition.

The films thus obtained by any of the foregoing processes preferably contain oxygen at a concentration of 5×10$^{21}$ cm$^{-3}$ or lower. If the oxygen concentration is too high, the film thus obtained would not crystallize. Accordingly, there would be required to elevate the thermal annealing temperature or to take a longer time for the thermal annealing. Too low an oxygen concentration, on the other hand, increases an off-state leak current due to a backlighting. Accordingly, the preferred range of the oxygen concentration was set in the range of from $4\times10^{19}$ to $4\times10^{21}$ atoms·cm$^{-3}$. The hydrogen concentration was for example $4\times10^{22}$ atoms·cm$^{-3}$, which accounts for 1% by atomic with respect to the silicon concentration of $4\times10^{22}$ atoms·cm$^{-3}$. To enhance crystallization of the source and drain portions, oxygen concentration is $7\times10^{19}$ atoms·cm$^{-3}$ or less, preferably $1\times10^{19}$ atoms·cm$^{-3}$ or less and oxygen may be added selectively by ion-implantation to the channel forming regions of the TFT which constitute the pixel, to such an amount to give a concentration in the range of from $5\times10^{20}$ to $5\times10^{21}$ atoms·cm$^{-3}$. Since no light was irradiated to the TFTs in the peripheral circuit, it was effective to impart thereto a higher carrier mobility while reducing the oxygen concentration in order to realize a high frequency operation.

After the amorphous silicon film was deposited at a thickness of from 500 to 5,000 Å, e.g., at a thickness of 1,500 Å, the amorphous silicon film was then heat-treated at a moderate temperature in the range of from 450 to 700° C. for a duration of from 12 to 70 hours in a non-oxidizing atmosphere. More specifically, the film was maintained at 600° C. under a hydrogen atmosphere. Since on the surface of the substrate was provided an amorphous silicon oxide layer under the silicon film, the whole structure was uniformly annealed because there was no nucleus present during the heat treatment.

The process can be explained as follows. That is, during the film deposition step, the film construction maintains the amorphous structure and the hydrogen is present as a mixture. The silicon film then undergoes phase transition from the amorphous structure to a structure having a higher degree of ordering by the annealing, and partly develops a crystallized portion. Particularly, the region which attains a relatively high degree of ordering at the film deposition of silicon tend to crystallize at this stage. However, the silicon bonding which bonds the silicon atoms each other attracts a region to another. This effect can be observed by a laser Raman spectroscopy as a peak shifted to a lower frequency side as compared with the peak at 522 cm$^{-1}$ for a single crystal silicon. The apparent grain size can be calculated by the half width as 50 to 500 Å, i.e., a size corresponding to that of a microcrystal, but in fact, the film has a semi-amorphous structure comprising a plurality of those highly crystalline regions yielding a cluster structure, and the clusters are anchored to each other by the bonding between the silicon atoms.

The semi-amorphous film yields, as a result, a state in which no grain boundary (referred to hereinafter as GB) exists. Since the carrier easily moves between the clusters via the anchoring, a carrier mobility far higher than that of a polycrystalline silicon having a distinct GB can be realized. More specifically, a hole mobility, $\mu h$, in the range of from 10 to 200 cm$^2$/V·sec and an electron mobility, $\mu e$, in the range of from 15 to 300 cm$^2$/V·sec, are achieved.

On the other hand, if a high temperature annealing in the temperature range of from 900 to 1200° C. were to be applied in the place of a moderate temperature annealing as described hereinabove, impurities undergo a solid phase growth from the nuclei and segregate in the film. This results in the high concentration of oxygen, carbon, nitrogen, and other impurities at the GB into a barrier. Thus, despite the high mobility within a single crystal, the carrier is interfered at its transfer from a crystal to another by the barrier at the GB. In practice, it is quite difficult to attain a mobility higher than or equal to 10 cm$^2$/V·sec with a polycrystalline silicon at the present. Thus, in the liquid crystal display device according to the present invention, a semi-amorphous or a semi-crystalline structured silicon semiconductor is utilized.

Figure 3A:
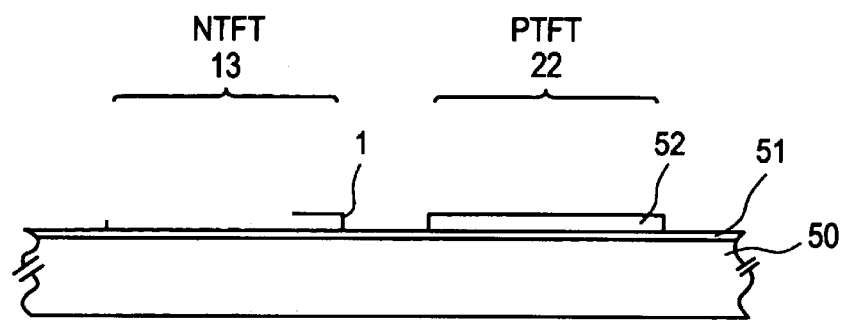
FIGS. 3(a)–3(d) are a schematic representation illustrating the fabrication process of a TFT according to an embodiment of the present invention.

Referring to FIG. 3(A), a process for fabricating a region 22 for a P-TFT and a region 13 for an N-TFT is described. The silicon film was masked with a first photomask <1>, and subjected to photo-etching to obtain the region 22 (having a channel width of 20 µm) for the P-TFT on the right-hand side of the FIGURE and the region 13 for the N-TFT on the left-hand side of the FIGURE.

On the resulting structure was deposited a silicon oxide film as the gate insulator film to a thickness of from 500 to 2,000 Å, e.g., to a thickness of 1,000 Å. The conditions or the film deposition were the same as those employed in depositing the silicon oxide film to give a blocking layer. Alternatively, a small amount of fluorine may be added during the film deposition to fix sodium ions.

Figure 3B:
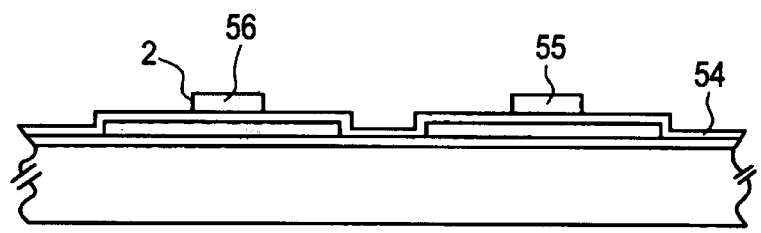
Figure 3C:
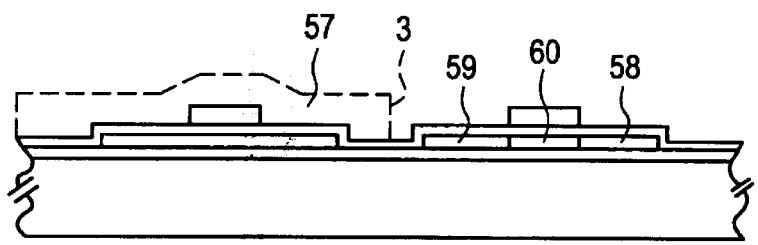
Figure 3D:
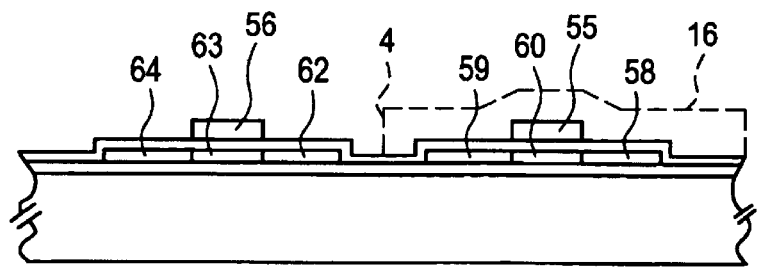

Further on the gate insulator film was deposited a silicon film doped with phosphorus at a concentration of from $1\times10^{21}$ to $5\times10^{21}$ atoms·cm$^{-3}$, or a multilayered film composed of said silicon film doped with phosphorus, having provided thereon a layer of molybdenum (Mo), tungsten (W), MoSi$_2$, or WSi$_2$. The resulting film was patterned using a second photomask <2> to obtain a structure as shown in FIG. 3(B). Then, a gate electrode 55 for the P-TFT, and a gate electrode 56 for the NTFT were established, for example, by depositing first a 0.2 µm thick phosphorus(P)-doped silicon and a 0.3 µm thick molybdenum layer thereon, at a channel length of 10 µm. Referring to FIG. 3(C), a photoresist 57 was provided using a photomask <3>, and to a source 59 and a drain 58 for the P-TFT were added boron by ion implantation at a dose of from $1\times10^{15}$ to $5\times10^{15}$ cm$^{-2}$. Then, as shown in FIG. 3(D), a photoresist 61 was provided using a photomask <4>, and to a source 64 and a drain 62 for the N-TFT was added phosphorus by ion implantation at a dose of from $1\times10^{15}$ to $5\times10^{15}$ cm$^{-2}$. The processes above were carried out via a gate insulator film 54. However, referring to FIG. 3(B), the silicon oxide on the silicon film may be removed utilizing the gate electrodes 55 and 56 as the masks, and then boron and phosphorus may be directly added to the silicon film by ion implantation.

The structure thus obtained was re-annealed by heating at 600° C. for a duration of from 10 to 50 hours. The impurities in the source 59 and drain 58 of the P-TFT and those in the source 64 and drain 62 of the N-TFT were activated to obtain P$^+$ and N$^+$ TFTs. Under the gate electrodes 55 and 56 were provided channel forming regions 60 and 63 with a semi-amorphous semiconductor.

According to the process for fabricating a liquid crystal display device of the present invention as described hereinabove, a CTFT can be obtained in a self-aligned method without elevating the temperature to 700° C. or higher. Thus, there is no need to use a substrate made of an expensive material such as quartz, and therefore it can be seen that the process is suited for fabricating liquid crystal display devices of large pixels according to the present invention.

The thermal annealing in this example was conducted twice, i.e., in the steps of fabricating the structures shown in FIGS. 3(A) and 3(D). However, the annealing at the step illustrated in FIG. 3(A) may be omitted depending to the desired device characteristics, and the annealing at the step shown in FIG. 3(D) can cover the total annealing. In this way it is possible to speed up the fabrication process.

Figure 3E:
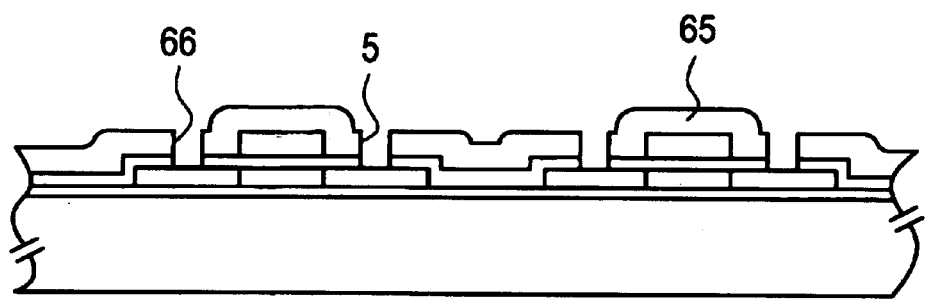

Referring to FIG. 3(E), a silicon oxide film was deposited as an interlayer insulator 65 by the sputtering process mentioned hereinbefore. The method of depositing the silicon oxide film is not restricted to a sputtering method, and there may be employed LPCVD, photo CVD, or normal pressure CVD. The silicon oxide film was deposited, e.g., to a thickness of from 0.2 to 0.6 μm, and on it was perforated an opening 66 for the electrode using a photomask <5>. The structure was then wholly covered with aluminum by sputtering, and after providing lead portions 71 and 72, as well as contacts 67 and 68 using a photomask <6>, the surface thereof was coated with a smoothening film of an organic resin 69 such as a transparent polyimide resin, and subjected again to perforation for the electrodes using a photomask <7>.

Figure 3F:
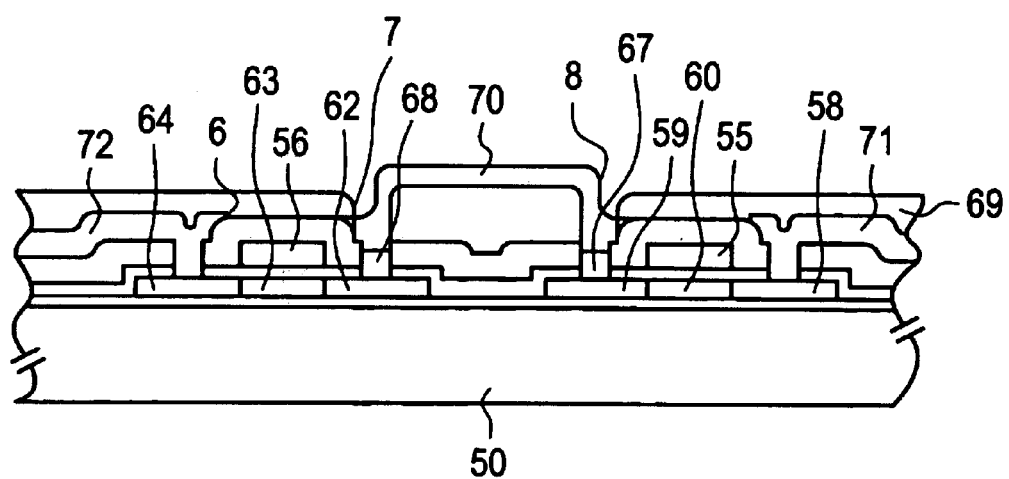

As shown in FIG. 3(F), two insulated gate field effect thin film transistors were established in a complementary structure. To the output terminal thereof was provided an Indium Tin Oxide (ITO) film by sputtering to thereby connect the TFTs with one of the transparent pixel electrodes of the liquid crystal display device. In this case, the ITO film was deposited in the temperature range from room temperature to 150° C., and then finished by annealing in oxygen or in atmosphere in the temperature range of from 200 to 400° C. The ITO film was then etched using a photomask <8> to form an electrode 70. Thus was finally obtained a structure comprising a P-TFT 22, an N-TFT 13, and an electrode 70 made of a transparent electrically conductive film on a single glass substrate 50. The resulting TFT yielded a mobility of 20 cm$^2$/V·sec and a $V_{th}$ of −5.9 V for the P-TFT, and a mobility of 40 cm$^2$/V·sec and a $V_{th}$ of 5.0 V for the N-TFT.

Referring to FIG. 6, the arrangement of electrodes and the like in the pixel portion of the liquid crystal display device is explained. An N-TFT 13 is assembled at the crossing of a first scanning line 15 and a data line 21, and another pixel N-TFT is provided at the crossing of the first scanning line 15 with another data line 14. On the other hand, a P-TFT is assembled at the crossing of a second scanning line 18 and a data line 21. Further, to the neighboring crossing of another first scanning line 16 and the data line 21 is provided another pixel N-TFT. Thus is accomplished a matrix structure using CTFTs. The N-TFT 13 is connected to the first scanning line 15 via a contact at the input terminal of the drain portion 64, and the gate portion 56 is connected to the data line 21 established in a multilayered wiring structure. The output terminal of the source portion 62 is connected to the pixel electrode 17 via a contact.

The P-TFT 22, on the other hand, is connected to the second scanning line 18 by the input terminal of the drain portion 58 via a contact, while the gate portion 55 is connected to the data line 21, and the output terminal of the source portion 59 is connected to the pixel electrode 17 via a contact in the same manner as in the N-TFT. In this manner is a single pixel established between (inner side) a pair of scanning lines 15 and 18, with a pixel 23 comprising a transparent electrode and a CTFT pair. By extending this basic pixel structure in four directions, a 2×2 matrix can be scaled up to give a large pixel liquid crystal display device comprising a 640×480 or a 1280×960 matrix.

Figure 4:
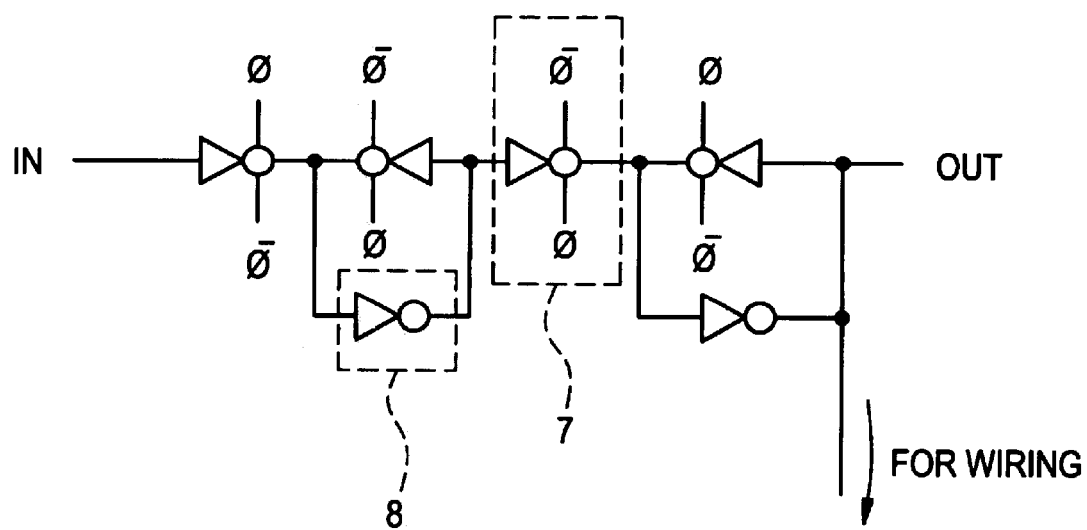
FIG. 4 is a schematic view of a peripheral circuit of a liquid crystal display device according to an embodiment of the present invention.
Figure 5A:
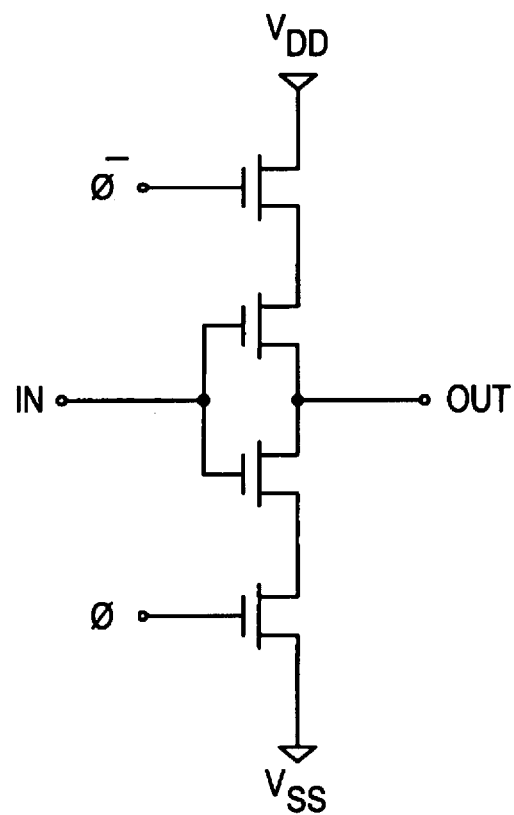
FIGS. 5(a) and 5(b) are a schematic representation of a connection of transistors of a peripheral circuit according to a liquid crystal display device of an embodiment of the present invention.
Figure 5B:
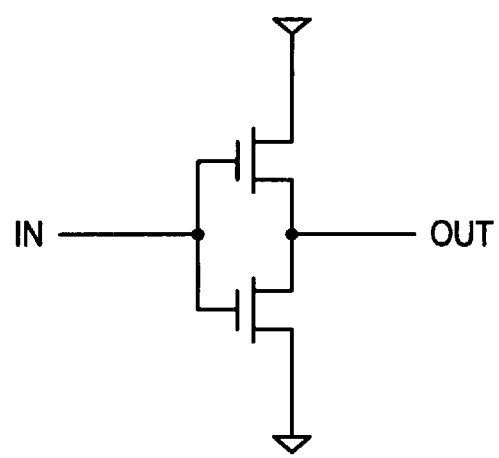

In FIGS. 4 and 5 are given the circuit diagrams for the peripheral circuit of the X direction. FIG. 4 illustrates the block function of the peripheral circuit being connected to a single wiring, and FIG. 5 shows the circuit diagram for connecting the transistor in the unit. FIG. 5(A) corresponds to the block 7 in FIG. 4, and FIG. 5(B) shows the circuit structure of the TFT corresponding to the block 8 in FIG. 4. It can be seen therefrom that the peripheral circuit is provided as a CMOS (complementary MOS) structure comprising an N-TFT 13 and a P-TFT 22 both fabricated in the same process as that employed for the switching device.

The substrate thus accomplished for use in the liquid crystal display device was laminated with the facing substrate by a known process, and an STN (super-twisted nematic) liquid crystal was injected between the substrates. The ICs 4 were used for the other part of the peripheral circuit. The ICs 4 were connected with each of the wirings for the Y direction on the substrate by a TAB process. Thus was completed a liquid crystal display device according to the present invention.

In the embodiment explained in the Example, only the peripheral circuit for the X direction was fabricated as TFTs following the same process used for the switching device, while leaving over the rest of the peripheral circuit as ICs having connected to the wirings of the Y direction. The present invention, however, is not only limited to this construction, and the portion which can be more easily fabricated into TFTs can be selected depending on the yield and the problems related to the process technology at the fabrication of the TFTs.

As described above, on the substrate a semiconductor film which comprises a semiconductor (amorphous silicon semiconductor in this Example) was formed extending over a display area and a peripheral circuit portion and subsequently the semiconductor (amorphous silicon semiconductor in this Example) is annealed into semi-amorphous or semi-crystal semiconductor. The semi-amorphous semiconductor yields a mobility ten times as high as, or even higher than that of the TFT using a conventional non-single crystal semiconductor. Thus, the TFT according to the present invention is well applicable to the peripheral circuits in which a rapid response is required, without subjecting the TFTs in the peripheral circuit portion to a special crystallization treatment which was requisite in the conventional TFTs; as a result, the TFTs for the peripheral circuit portion could be fabricated by the same process utilized for fabricating an active device of the display area, as described above.

EXAMPLE 2

Figure 7:
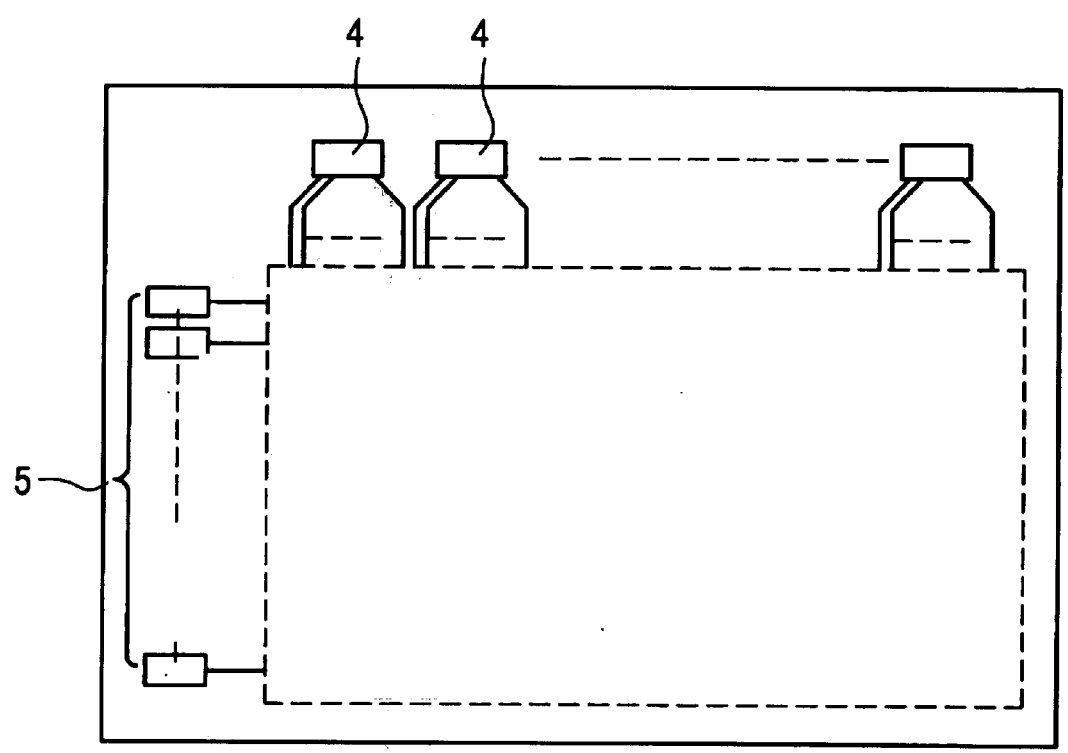
FIG. 7 is a schematic representation of a liquid crystal display device according to another embodiment of the present invention.

In FIG. 7 is given a schematic view of a liquid crystal display device according to another embodiment of the present invention. The basic circuits and the like are the same as those employed in the liquid crystal display device described in Example 1. Referring to FIG. 7, the peripheral circuit connected to the wirings for the Y direction is constructed with ICs 4, and the ICs 4 are directly provided on the substrate by a COG method.

The pad electrodes of the ICs 4 can be connected with the wirings of the Y direction at a narrower interval by the use of a COG method instead of the TAB method. Thus, the process of the present example enables a finer display pixel design. Furthermore, since the ICs are provided on the substrate, the total volume of the display device remains almost unchanged to give a thinner liquid crystal display device.

EXAMPLE 3

Figure 8:
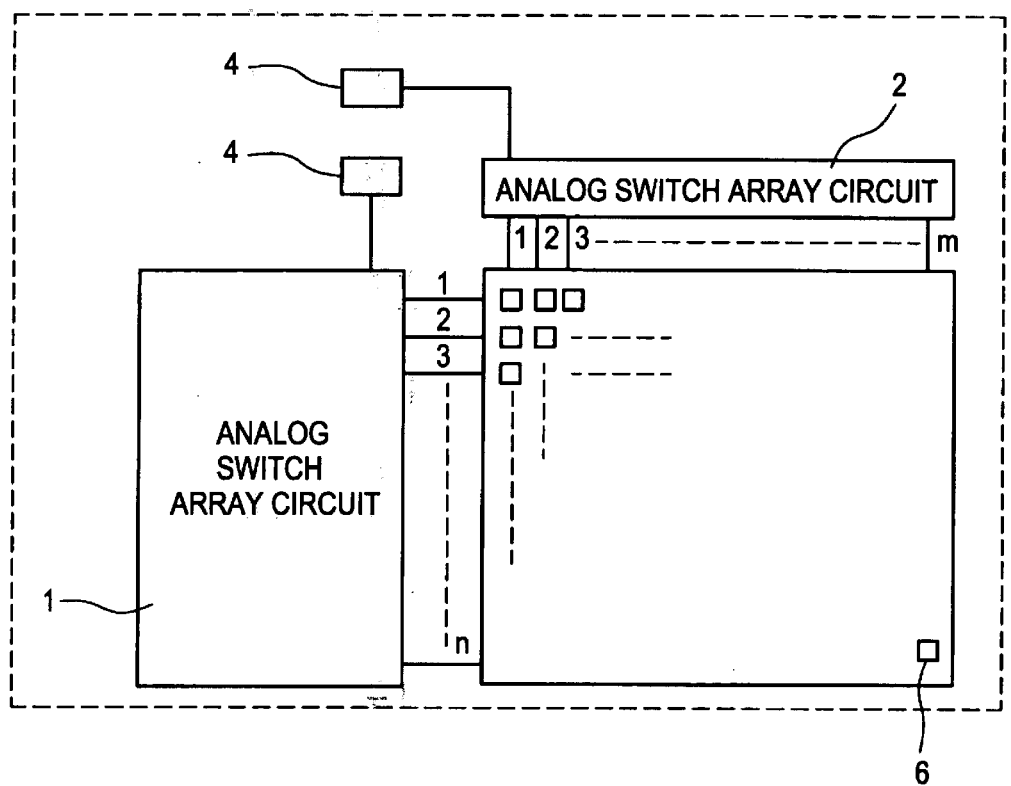
FIG. 8 is a schematic view illustrating a liquid crystal display device according to another embodiment of the present invention, composed of an m×n circuit structure.

Referring to FIG. 8, a liquid crystal display device having an m×n circuit structure is described below. Among the peripheral circuit portions (a means for supplying a signal to wirings of the X direction) connected to the wirings of the X direction, only an analog switch array circuit portion 1 is fabricated as TFTs in the same process as that used for fabricating the active device provided to a pixel 6. Furthermore, only an analog switch array circuit portion 2 in the peripheral circuit portion (a means for supplying a signal to wirings of the Y direction) connected to the wirings of the Y direction is also fabricated as TFTs, while providing the rest of the peripheral circuit portion by making them into ICs 4 having connected to a substrate using a COG method. The peripheral circuit portion provided as TFTs is in a CTFT structure (complementary structure) similar to the active device established to the pixels.

In FIG. 6 is provided the actual arrangement of the electrodes and the like corresponding to the circuit structure described above. However, the portion shown in FIG. 6 corresponds to a 2×2 matrix for the sake of simplicity.

Electrodes, TFTs, wirings, and the like were formed on a single substrate in the same fabrication process as that used in Example 1. In this process, the switching device (e.g. TFTs 13 and 22 in FIG. 6) and a part of the peripheral circuits were fabricated in TFTs on the same substrate. This substrate was laminated with the facing substrate and an STN liquid crystal was injected between the substrates in the same manner as in Example 1. The remaining peripheral circuit was established as ICs 4. The ICs 4 were connected with each of the wirings of the X and Y directions by a COG method. To the ICs 4 was connected each of the connection leads for power supply and data input, but there was no FPC attached all over one edge of the substrate for the connection. The reliability of the liquid crystal display device was increased by thus reducing the number of connections.

In the liquid crystal display device described in the present Example, only the analog switch array circuit portion 1 among the peripheral circuit of the X direction and the analog switch array circuit portion 2 among the peripheral circuit of the Y direction were fabricated into complementary TFTs in the same process as that used for fabricating a switching device. The remaining peripheral circuit portion was provided as the ICs 4. However, a liquid crystal display device is not restricted to this structure and the portion which can be more easily fabricated as TFTs can be selected and fabricated as TFTs, depending on the yield and the problems related to the process technology at the fabrication thereof. In an embodiment according to the present invention as referred in this Example, a semi-amorphous semiconductor was used for the semiconductor film. It yields a mobility ten times or more higher than that of the TFT using a conventional non-single crystal semiconductor. Thus, the TFT according to the present invention is well applicable to peripheral circuits in which a rapid response is required, without subjecting the TFTs in the peripheral circuit portion to a special crystallization treatment which was requisite in the conventional TFTs; as a result, the TFTs for the peripheral circuit portion could be fabricated by the same process utilized for fabricating an active device.

Furthermore, since a CTFT structure is employed for the active matrix being connected to the liquid crystal pixels, the operational margin was increased and a constant display level could be maintained without fluctuation in the pixel voltage. Even when malfunctioning occurred on one of the TFTs, it was possible to maintain the display without suffering a perceptible defect.

EXAMPLE 4

Figure 9:
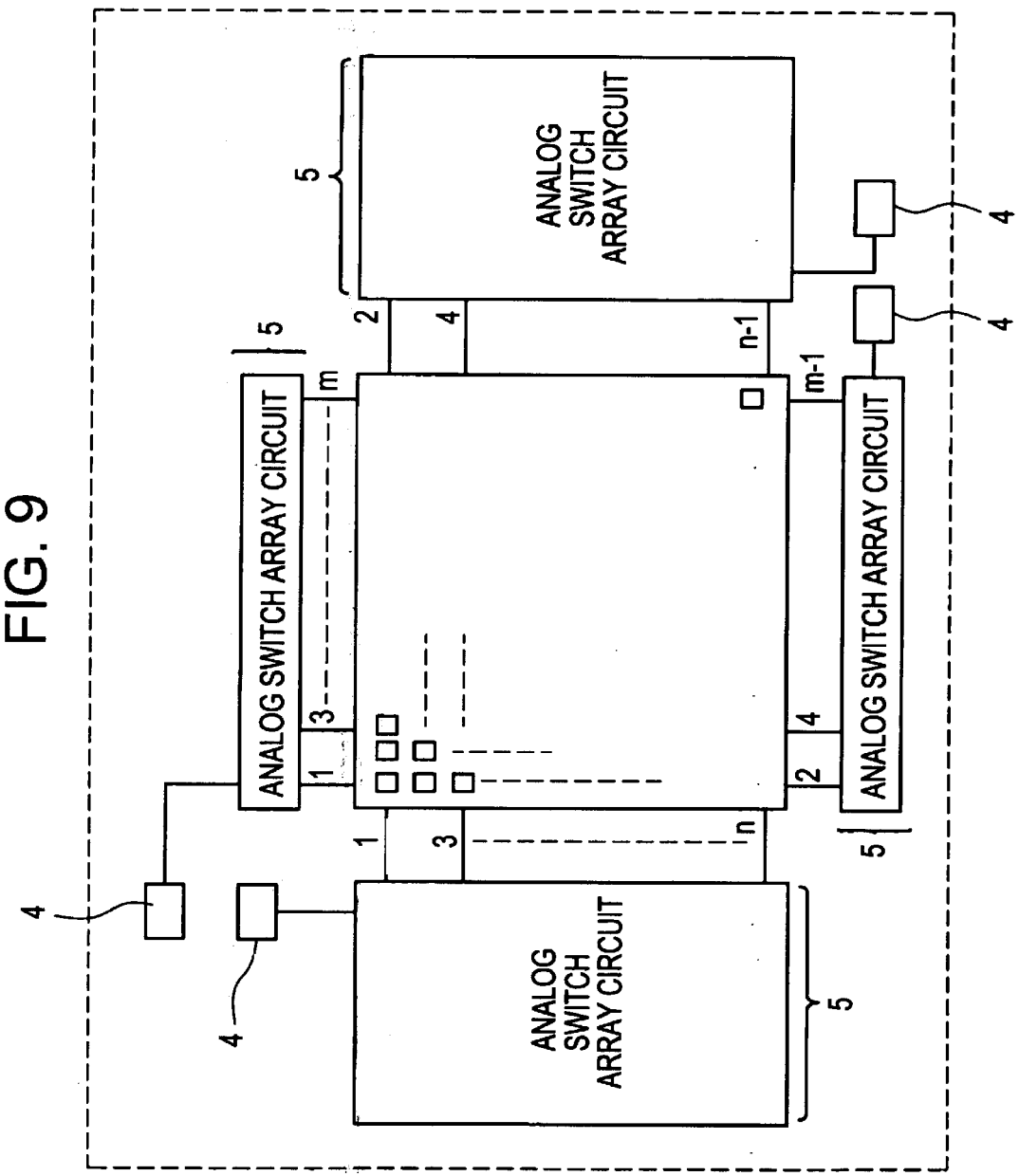
FIG. 9 is a schematic representation of a liquid crystal display device according to another embodiment of the present invention.

Referring to a schematic diagram in FIG. 9, a liquid crystal display device according to another embodiment of the present invention is described below. The basic circuits and the like are the same as those of the liquid crystal display device described in Example 3. Among the peripheral circuits connected to the wirings of the Y direction in FIG. 9, the peripheral circuit portion composed of ICs 4 comprises ICs having directly established on the substrate by a COG method. The ICs 4 are divided into two portions, and one of them is provided at the upper portion of the substrate and the other is provided at the lower portion of the substrate. By employing such an arrangement, the pad electrodes of the ICs 4 and the wirings of the Y direction can be connected at a narrower interval as compared with the case in which the ICs are provided only on one side of the substrate. This structure can be therefore characterized by a finer display pixel design. Furthermore, since the ICs are directly bonded on the substrate, the structure can be realized with a negligible change in volume and hence enables a thinner liquid crystal display device.

In the examples described above, the TFTs of the active device were each fabricated into a CMOS structure. However, this structure is not requisite and modifications such as constructing the structure with only N-TFTs or with only P-TFTs are also acceptable. In these cases, however, the number of the devices in the peripheral circuit would be increased.

Furthermore, the position at which the TFTs are established can be varied. That is, the TFT need not be provided only to one side, i.e., only to either of the sides connected to the wirings of the X direction and the Y direction, but there may be also provided a second TFT on the other side to connect the TFTs in turns to halve the TFT density. Such a structure realizes an increase in the production yield.

The present invention provides a fine and precise liquid crystal display by overcoming the problems ascribed to the limitations related to the technological difficulty in the peripheral connections. Furthermore, the reliability on the connections is improved, since unnecessary connections between the outer peripheral circuits and the wirings along the X and Y directions are minimized.

The area occupation of the display substrate itself is reduced, since only a part of the peripheral circuits are fabricated into a TFT. It also allows a more freely designed substrate having a shape and dimension according to the requirements. Further it is possible to reduce the production cost, since the problems related to the production of the TFTs can be avoided while making those portions having a higher production yield into TFTs.

The use of a semi-amorphous semiconductor as the semiconductor film of the TFTs enables a rapid response, making the TFTs well applicable to peripheral circuits. Thus, the TFTs for the peripheral circuits are readily fabricated simultaneously utilizing the fabrication process for the active devices without any additional special treatments.

The liquid crystal display device according to the present invention provides a stable display because it operates without floating the liquid crystal potential. Furthermore, since the drive capacity of the CTFTs which function as the active devices is high, the operational margin is increased. Since the peripheral driving circuit can be further simplified, it results in a more compact display device which is produced at a lower production cost. A high driving capacity can be realized with three signal lines and counter electrodes using a very simple signal. It is also possible to increase the switching rate. Even when a part of the TFTs should get out of order, a compensation function works to a certain degree. Since the carrier mobility increases to 10 times or more than that of a TFT using an amorphous silicon, the size of the TFT can be minimized and two TFTs can be connected to a single pixel without decreasing the aperture ratio. Furthermore, the advantages enumerated above can be realized by only using twice more the photomasks as compared with a conventional process in which only N-TFTs are used.

While the invention has been described in detail and with reference to specific embodiments thereof, it will be apparent to one skilled in the art that various changes and modifications can be made therein without departing from the spirit and scope thereof.

What is claimed is:

1. A display device comprising;

a substrate;

a plurality of first signal lines formed over said substrate;

a plurality of second signal lines extending across said first signal lines over said substrate;

a plurality of switching elements formed at each intersection of said first and second signal lines, each of said switching elements comprising at least one first thin film transistor wherein a gate electrode of said first thin film transistor is electrically connected to one of said plurality of first signal lines and an impurity region of said first thin film transistor is electrically connected to one of said plurality of second signal lines;

a smoothing film comprising an organic resin formed over said switching elements;

a plurality of pixel electrodes formed over said smoothing film and electrically connected to said switching elements through contact holes formed in said smoothing film; and a first driver circuit comprising at least one IC chip electrically connected to said plurality of second signal lines; and a second driver circuit electrically connected to said plurality of first signal lines, wherein said second driver circuit comprises second thin film transistors formed over said substrate.

2. The display device according to claim 1 wherein said pixel electrodes comprise indium tin oxide.

3. The display device according to claim 1 wherein at least one of said first and second thin film transistors has a channel region comprising semi-amorphous silicon.

4. The display device according to claim 1 wherein each of said first and second thin film transistors has a top-gate structure.

5. The display device according to claim 1 wherein said smoothing film comprises polyimide.

6. A display device comprising:

a substrate;

a plurality of first signal lines formed over said substrate;

a plurality of second signal lines extending across said first signal lines over said substrate;

a plurality of switching elements formed at each intersection of said first and second signal lines, each of said switching elements comprising at least one first thin film transistor, wherein a gate electrode ol said first thin film transistor is electrically connected to one of said plurality of first signal hues and an impurity region of said first thin film transistor is electrically connected to one of said plurality of second signal lines;

a smoothing film comrising an organic resin fonned over said switching elements;

a plurality of pixel electrodes formed over said smoothing film and electrically connected to said switching elements through contact holes formed in said smoothing film; and a first driver circuit comprising at least one IC chip electrically connected to said plurality of second signal lines; and a second driver circuit electrically connected to said plurality of first signal lines, wherein said second driver circuit comprises second thin film transistors formed over said substrate, wherein said first driver circuit is connected to said substrate through a tape automated bonding process.

7. The display device according to claim 6 wherein said IC chip is mounted on a flexible support.

8. The display device according to claim 6 wherein said pixel electrodes comprise indium tin oxide.

9. The display device according to claim 6 wherein at least one of said first and second thin film transistors has a channel region comprising semi-amorphous silicon.

10. The display device according to claim 6 wherein each of said first and second thin film transistors has a top-gate structure.

11. A display device comprising:

a substrate;

a plurality of first signal lines formed over said substrate;

a plurality of second signal lines extending across said first signal lines over said substrate;

a plurality of switching elements formed at each intersection of said first and second signal lines, each of said switching elements comprising at least one thin film transistor;

a smoothing film comprising an organic resin formed over said switching elements;

a plurality of pixel electrodes formed over said smoothing film and electrically connected to said switching elements through contact holes formed in said smoothing film; and a driver circuit comprising at least one IC chip for driving said switching elements, wherein said IC chip is formed on a flexible support and said flexible support is connected to said substrate.

12. The display device according to claim 11 wherein said thin film transistor has a top-gate structure.

13. The display device according to claim 11 wherein said pixel electrodes comprise indium tin oxide.

14. The display device according to claim 11 wherein said IC chip is electrically connected to either one of said first signal lines or said second signal lines.

15. The display device according to claim 11 wherein said driver circuit further comprises thin film transistors formed over said substrate.

16. The display device according to claim 11 wherein said thin film transistor has a channel region comprising semi-amorphous silicon.

17. A display device comprising:

a substrate;

a plurality of first signal lines formed over said substrate;

a plurality of second signal lines extending across said first signal lines over said substrate;

a plurality of switching elements formed at each intersection of said first and second signal lines, each of said switching elements comprising at least one first thin film transistor, wherein a gate electrode of said first thin film transistor is electrically connected to one of said plurality of first signal lines and an impurity region of said first thin film transistor is electrically connected to one of said plurality of second signal lines;

a smoothing film comprising an organic resin formed over said switching elements;

a plurality of pixel electrodes formed over said smoothing film and electrically connected to said switching elements through contact holes formed in said smoothing film; and a first driver circuit comprising at least one IC chip electrically connected to said plurality of second signal lines; and a second driver circuit electrically connected to said plurality of first signal lines wherein said second driver circuit comprises second thin film transistors formed over said substrate, wherein said IC chip is mounted over said substrate.

18. The display device according to claim 17 wherein each of said first and second thin film transistors has a top-gate structure.

19. The display device according to claim 17 wherein said pixel electrode comprise indium tin oxide.

20. The display device according to claim 17 wherein at least one of said first and second thin film transistors has a channel region comprising semi-amorphous silicon.

21. A display device comprising:

a substrate;

a plurality of first signal lines formed over said substrate;

a plurality of second signal lines extending across said first signal lines over said substrate;

a plurality of switching elements formed at each intersection of said first and second signal lines, each of said switchihg elements comprising at least one first thin film transistor wherein a gate electrode of said first thin film transistor is electrically connected to one of said plurality of first signal lines and an impurity region of said first thin film transistor is electrically connected to one of said plurality of second signal lines;

an organic resin film formed over said switching elements;

a plurality of pixel electrodes formed over said organic resin film and electrically connected to said switching elements through contact holes formed in said organic resin film; and a first driver circuit comprising at least one IC chip electrically connected to said plurality of second signal lines; and a second driver circuit electrically connected to said plurality of first signal lines, wherein said second driver circuit comprises second thin film transistors formed over said substrate.

22. The display device according to claim 21 wherein said organic resin film comprises polyimide.

23. The display device according to claim 21 wherein each of said first and second thin film transistors has a top-gate structure.

24. A display device comprising:

a substrate;

a plurality of first signal lines formed over said substrate;

a plurality of second signal lines extending across said first signal lines over said substrate;

a plurality of switching elements formed at each intersection of said first and second signal lines, each of said switching elements comprising at least one thin film transistor;

an organic resin film formed over said switching elements;

a plurality of pixel electrodes formed over said organic resin film and electrically connected to said switching elements through contact holes formed in said organic resin film; and a driver circuit comprising at least one IC chip for driving said switching elements, wherein said IC clip is formed on a flexible support and said flexible support is connected to said substrate.

25. The display device according to claim 24 wherein said organic resin film comprises polyimide.

26. The display device according to claim 24 wherein said driver circuit includes a first driver circuit including said IC chip and electrically connected to said plurality of second signal lines and a seconds driver circuit comprising second thin film transistors and electrically connected to said plurality of first signal lines.

27. A display device comprising:

a substrate;

a plurality of first signal lines formed over said substrate;

a plurality of second signal lines extending across said first lines over said substrate;

a plurality of switching elements formed at each intersection of said first and second signal lines, each of said switching elements comprising at least one first thin film transistor, wherein a gate electrode of said first thin film transistor is electrically connected to one of said plurality of fitst signal lines and an impurity region of said first thin film transistor is electrically connected to one of said plurality of second signal lines;

an organic resin film formed over said switching elements;

a plurality of pixel electrodes formed over said organic resin film and electrically connected to said switching elements through contact holes formed in said organic resin film; and a first driver circuit cornpnsing at least one IC chip electrically connected to said plurality of second signal lines; and a second driver circuit electrically connected to said plurality of first signal lines wherein said second driver circuit comprises second thin film transistors formed over said substrate, wherein said IC chip is mounted over said substrate.

28. The display device according to claim 27 wherein said organic resin film comprises polyimide.

29. The display device according to claim 27 wherein each of said first and second thin film transistors has a top-gate structure.

30. A display device comprising:

a substrate;

a plurality of first signal lines formed over said substrate;

a plurality of second signal lines extending across said first signal lines over said substrate;

a plurality of switching elements formed at each intersection of said first and second signal lines, each of said switching elements comprising at least one first thin film transistor wherein a gate electrode of said first thin film transistor is electrically connected to one of said plurality of first signal lines and an impurity region of said first thin film transistor is electrically connected to one of said plurality of second signal lines;

a smoothing film formed over said switching elements;

a plurality of pixel electrodes formed over said smoothing film and electrically connected to said switching elements through contact holes formed in said smoothing film; and a first driver circuit comprising at least one IC chip electrically connected to said plurality of second signal lines; and a second driver circuit electrically connected to said plurality of first signal lines, wherein said second driver circuit comprises second thin film transistors formed over said substrate.

31. The display device according to claim 30 wherein each of said first and second thin film transistors has a top-gate structure.

32. A display device comprising:

a substrate;

a plurality of first signal lines formed over said substrate;

a plurality of second signal lines extending across said first signal lines over said substrate;

a plurality of switching elements formed at each intersection of said first and second signal lines, each of said switching elements comprising at least one thin film transistor;

a smoothing film formed over said switching elements;

a plurality of pixel electrodes formed over said smoothing film and electrically connected to said switching element through contact holes formed in said smoothing film; and a driver circuit comprising at least one IC chip for driving said switching elements, wherein said IC chip is formed on a flexible support and said flexible support is connected to said substrate.

33. The display device according to claim 32 wherein said driver circuit includes a first driver circuit including said IC chip and electrically connected to said plurality of second signal lines and a second driver circuit comprising second thin film transistors and electrically connected to said plurality of first signal lines.

34. A display device comprising:

a substrate;

a plurality of first signal lines formed over said substrate;

a plurality of second signal lines extending across said first signal lines over said substrate;

a plurality of switching elements formed at each intersection of said first and second signal lines, each of said switching elements comprising at least one first thin film transistor, wherein a gate electrode or said first thin film transistor is electrically connected to one of said plurality of first signal lines and an impurity region of said first thin film transistor is electrically connected to one of said plurality of second signal lines;

a smoothing film formed over said switching elements;

a plurality of pixel el&trodes formed over said smoothing film and electrically connected to said switching elements through contact holes formed in said smoothing film; and a first driver circuit comprising at least one IC chip electrically connected to said plurality of second signal lines; and a second driver circuit electrically connected to said plurality of first signal lines wherein said second driver circuit comprises second thin film transistors formed over said substrate, wherein said IC chip is mounted over said substrate.

35. The display device according to claim 11 wherein said driver circuit includes a first driver circuit including said IC chip and electrically connected to said plurality of second signal lines and a second driver circuit comprising second thin film transistors and electrically connected to said plurality of first signal lines.

36. The display device according to claim 1 wherein each of said first and second driver circuits comprises a shift register circuit.

37. The display device according to claim 6 wherein each of said first and second driver circuits comprises a shift register circuit.

38. The display device according to claim 17 wherein each of said first and second driver circuits comprises a shift register circuit.

39. The display device according to claim 21 wherein each of the first and second driver circuits comprises a shift register circuit.

40. The display device according to claim 27 wherein each of the first and second driver circuits comprises a shift register circuit.

41. The display according to claim 30 wherein each of the first and second driver circuits comprises a shift register circuit.

42. The display device according to claim 34 wherein each of the first and second driver circuits comprises a shift register circuit.

43. The display device according to claim 1 wherein each of said first and second comprises a latch circuit.

44. The display device according to claim 6 wherein said first driver circuit comprises a latch circuit.

45. The display device according to claim 17 wherein said first driver circuit comprises a latch circuit.

46. The display device according to claim 21 wherein said first driver circuit comprises a latch circuit.

47. The display device according to claim 27 wherein said first driver circuit comprises a latch circuit.

48. The display device according to claim 30 wherein said first driver circuit comprises a latch circuit.

49. The display device according to claim 34 wherein said first driver circuit comprises a latch circuit.

\* \* \* \* \*